(12) United States Patent
Zhang et al.

(10) Patent No.: US 8,120,402 B2
(45) Date of Patent: *Feb. 21, 2012

(54) PWM CONTROL CIRCUIT HAVING ADJUSTABLE MINIMUM DUTY CYCLE

(75) Inventors: Zhihong Zhang, Shanghai (CN); Xujiang Huang, Shanghai (CN)

(73) Assignee: BCD Semiconductor Manufacturing Limited (KY)

( * ) Notice: Subject to any disclaimer, the term of this patent is extended or adjusted under 35 U.S.C. 154(b) by 141 days.

This patent is subject to a terminal disclaimer.

(21) Appl. No.: 12/425,366

(22) Filed: Apr. 16, 2009

(65) Prior Publication Data

US 2010/0109730 A1    May 6, 2010

(30) Foreign Application Priority Data

Oct. 30, 2008 (CN) ...................... 2008 2 0177449 U

(51) Int. Cl.
*H03K 3/017* (2006.01)
*H03K 5/04* (2006.01)
*H03K 7/08* (2006.01)

(52) U.S. Cl. ...................................... 327/175
(58) Field of Classification Search .............. 327/175
See application file for complete search history.

(56) References Cited

U.S. PATENT DOCUMENTS

| | | | |
|---|---|---|---|
| 6,943,517 B2 * | 9/2005 | Yoshitomi et al. | 318/471 |
| 7,612,521 B2 | 11/2009 | Miyajima | |
| 7,646,162 B2 | 1/2010 | Ma | |
| 7,961,022 B2 | 6/2011 | Zhang | |
| 2008/0044165 A1 | 2/2008 | Miyajima | |
| 2008/0088268 A1 | 4/2008 | Sakaguchi | |
| 2010/0054964 A1 | 3/2010 | Teng et al. | |
| 2010/0164581 A1 | 7/2010 | Zhang et al. | |

OTHER PUBLICATIONS

U.S. Appl. No. 12/500,923, filed Jul. 10, 2009, Zhang et al.
Office Action for U.S. Appl. No. 12/500,923, mailed on Oct. 12, 2010, 8 pages.
Notice of Allowance for U.S. Appl. No. 12/500,923, mailed on Feb. 8, 2011, 6 pages.

* cited by examiner

*Primary Examiner* — Lincoln Donovan
*Assistant Examiner* — Daniel Rojas
(74) *Attorney, Agent, or Firm* — Kilpatrick Townsend & Stockton LLP

(57) ABSTRACT

A pulse width modulated (PWM) controller includes a triangle wave generation circuit generating a triangle wave signal to oscillate between an upper limit voltage and a lower limit voltage. The upper limit voltage and the lower limit voltage are adjustable in response to changes in the power supply voltage. A pulse generation circuit is coupled to the triangle wave generation circuit and a minimum duty cycle setting voltage, and is configured to generate a PWM pulse signal with a minimum duty cycle determined by the relative magnitude of the triangle wave signal and the minimum duty cycle reference voltage. In an embodiment, the minimum duty cycle is increased when the power supply voltage is lower than a predetermined reference voltage.

16 Claims, 7 Drawing Sheets

PWM CONTROL CIRCUIT HAVING ADJUSTABLE MINIMUM DUTY CYCLE

CROSS-REFERENCES TO RELATED APPLICATIONS

This application claims priority to Chinese Patent Application No. 200820177449.5 filed Oct. 30, 2008, which is commonly owned and incorporated herein by reference in its entirety for all purposes.

FIELD OF INVENTION

The present invention relates generally to pulse width modulation (PWM) control circuits. More particularly, the invention provides methods and apparatus for a PWM control circuit which adjusts the minimum duty cycle of the PWM control pulse in response to changes in the power supply voltage.

BACKGROUND OF THE INVENTION

Regulated power sources are indispensable in modern electronics. For example, the power supply in a personal computer often needs to receive power input from various outlets. Desktop and laptop computers often have regulated power supplies on the motherboard to supply power to the CPU, memories, and periphery circuitry. Regulated power supplies are also used in a wide variety of consumer applications, such as home appliances, automobiles, and portable chargers for mobile electronic devices, etc.

Additionally, regulated power sources are also used in other applications. For example, a regulated voltage is often used to control the speed of a DC motor, e.g., for driving a cooling fan in a computer. As modern personal computers become more powerful, they consume more power and generate more heat. As a result, regulator circuits for fan speed control have become increasingly prevalent.

In general, a voltage or current source can be regulated using a linear regulator or a switching mode controller. A linear regulator maintains the desired output voltage by dissipating excess power. In contrast, a switching mode controller rapidly switches a power transistor on and off with a variable duty cycle or variable frequency and provides an average output that is the desired output voltage.

Switching mode power supplies (SMPS) have the advantages of smaller size, higher efficiency and larger output power capability, and are widely applied in mobile phone chargers, notebook computer adapters, and other fields. In recent years, green power supplies are emphasized, which require higher conversion efficiency and especially lower standby power consumption.

Pulse Width Modulation (PWM) control circuits have been widely used in switching mode power supplies. In PWM control circuits, the duty cycle of the control pulse is used to control the output of a device. In various applications, it is often desirable to set a minimum duty cycle of the output pulse, such that the duty cycle of the output pulse of the PWM control circuit does not become smaller than a predetermined value.

FIG. 1A illustrates the operation of a conventional PWM controller circuit having a minimum duty cycle feature. FIG. 1A shows a triangle wave signal 102, an input control signal 104, a minimum duty cycle setting voltage 106, and a PWM output signal 108. As shown, triangle wave signal 102 oscillates between an upper limit voltage VH and a lower limit voltage limit VL. The duty cycle of PWM output signal 108 is determined by comparing triangle wave signal 102 with a reference voltage. In an example, the PWM output signal is high when triangle wave signal is higher than the reference voltage, and PWM output signal is low when the triangle wave signal is lower than the reference voltage. In FIG. 1A, the reference voltage is the lower one of input control signal 104 and minimum duty cycle setting voltage 106, which intersect each other at crossover point 110. When input control signal 104 is lower than triangle wave signal 102, as shown in FIG. 1A to the left of crossover point 110, the duty cycle of PWM output signal 108 is controlled by input control signal 104. When input control signal 104 is higher than minimum duty cycle setting voltage 106, as shown in FIG. 1A to the right of crossover point 110, the minimum duty cycle feature is in activated, and the duty cycle of PWM output signal 108 is controlled by minimum duty cycle setting voltage 106.

Even though conventional PWM controllers are used in some applications, they suffer from many limitations. As discussed below, these limitations include insufficient power output at low power supply conditions and inefficient power utilization at high power supply conditions.

From the above, it is seen that improved PWM control circuits and methods are desired.

BRIEF SUMMARY OF THE INVENTION

Embodiments of the present invention provide methods and apparatus for changing the duty cycle output of a PWM controller depending on the power supply voltage. In some embodiments, the PWM control signals are generated based on a comparison of an input signal with a triangle wave signal. In these embodiments, the triangle wave signal is adjusted in response to a change of the power supply voltage. In some embodiments, the triangle wave signal is raised when the power supply is below a certain reference voltage, such that the duty cycle is increased under low voltage conditions. In certain embodiments, a minimum duty cycle setting voltage is used to determine a minimum duty cycle. With the adjustable triangle wave signal, the minimum duty cycle is also raised under low voltage conditions.

In embodiments of the present invention, a PWM controller can have one or more of the following advantages. For example, a PWM controller can increase the duty cycles to provide sufficient power for start up or operation at low power supply conditions. Similarly, in another embodiment, the duty cycles can be reduced under high power supply conditions such that efficient power utilization can be achieved. The latter advantage can be achieved, for example, by lowering the duty cycle when the power supply exceeds a certain reference voltage. Additionally, in some PWM controllers, it may be desirable to maintain a certain relationship between the minimum duty cycle setting voltage and the input signal. In this case, the conventional method of changing the minimum duty cycle setting voltage may require a corresponding change of the input signal, and adds complexity. In contrast, varying the triangle wave signal is a simpler method for duty cycle adjustment in response to power supply levels, while maintaining the relationship among the other signals.

According to a specific embodiment of the invention, a pulse width modulated (PWM) controller includes a power supply terminal for receiving a power supply voltage, a ground terminal, an input terminal for receiving an input signal, and an output terminal for outputting a PWM pulse signal. Moreover, the controller includes a triangle wave generation circuit for generating a triangle wave signal configured to oscillate between an upper limit voltage and a lower limit voltage. The upper limit voltage and the lower limit voltage are adjustable in response to a change in the power supply. Additionally, a pulse generation circuit is coupled to the input terminal, the triangle wave generation circuit, and a minimum duty cycle setting voltage. The pulse generation circuit is configured to generate the PWM pulse signal, which has a minimum duty cycle determined by the relative magnitude of the triangle wave signal and the minimum duty cycle reference voltage. In this embodiment, the minimum duty cycle is adjustable in response to a change in the power supply.

In an embodiment of the above PWM controller, the upper limit voltage and the lower limit voltage of the triangle wave signal are raised when the power supply voltage is lower than a predetermined reference voltage. In some embodiments, the triangle wave generation circuit includes a capacitor having an output terminal for providing the triangle wave signal, a first current source coupled to the capacitor through a diode and configured for charging the capacitor, and a second current source coupled to the capacitor and being configured for discharging the capacitor. The triangle wave generation circuit also includes a variable reference voltage source configured to provide the upper limit voltage when the capacitor is being charged and the lower limit voltage when the capacitor is being discharged. The variable reference voltage source is further configured to receive a bias current for raising the upper limit voltage and the lower limit voltage when the power supply voltage is lower than the predetermined reference voltage. The triangle wave generation circuit also has a first comparator having a first input coupled to the capacitor and a second input coupled to the variable reference voltage source and a first switch transistor configured to couple the first current source to the capacitor in response to the output of the comparator.

In an embodiment, the above variable reference voltage source includes a first voltage divider having a first resistor, a second resistor, and a third resistor connected in series between the power supply terminal and the ground terminal. A first node between the first and the second resistors is used for providing the upper limit voltage and the lower limit voltage of the triangle wave signal. The first node is also adapted for receiving the bias current that is configured to raise the upper limit voltage and the lower limit voltage. Additionally, a second switch transistor is coupled to the first comparator and to a second node between the second and the third resistors. The second switch transistor is configured to connect the second node to the ground in response to the output of the comparator.

In an embodiment, the PWM controller described above also has a supply voltage detector and controller configured to provide the bias current. The supply voltage detector and controller includes a second voltage divider having a fourth resistor and a fifth resistor connected between the power supply terminal and the ground terminal. The second voltage divider has a third node between the fourth resistor and the fifth resistor for sensing the power supply voltage. A second comparator is coupled to the third node for comparing the sensed voltage with the predetermined reference voltage. A third current source is coupled to an output of the second comparator for providing the bias current when the sensed voltage is lower than the predetermined reference voltage.

In another embodiment of the above PWM controller, the supply voltage detector and controller also includes a fourth current source coupled to the third node for producing a hysteresis voltage in the fourth resistor when the sensed voltage is lower than the predetermined reference voltage. In another embodiment, the first current source is configured to provide a current that is approximately twice the current provided by the second current source.

In a specific embodiment of the above PWM controller, the PWM pulse signal includes a first state and a second state. The PWM pulse signal is in the first state when the lower one of the input signal and the minimum duty cycle reference voltage is lower than the triangle wave signal, whereas the PWM pulse signal is in the second state when the lower one of the input signal and the minimum duty cycle reference voltage is higher than the triangle wave signal. In some embodiments, the first state and the second state can be high and low states, respectively. Depending on the application, the high state of the PWM pulse signal may be used to turn on the output device. In other applications, the low state may be used to turn on the output device. In an embodiment, the pulse generation circuit includes a third comparator having at least three input terminals configured to receive the triangle wave signal, the input signal, and the minimum duty cycle reference voltage, respectively. In some embodiments, the minimum duty cycle setting voltage is provide by a minimum duty cycle setting circuit. In an embodiment, the minimum duty cycle setting circuit has a sixth resistor and a seventh resistor connected between the power supply terminal and the ground terminal. A sixth node between the sixth and the seventh resistors is used for providing the minimum duty cycle setting voltage.

According to another embodiment of the present invention, a pulse width modulated (PWM) controller having an adjustable duty cycle includes a power supply terminal for receiving a power supply voltage, a ground terminal, an input terminal for receiving an input signal, and an output terminal for outputting a PWM pulse signal. The PWM controller also has a triangle wave generation circuit for generating a triangle wave signal configured to oscillate between an upper limit voltage and a lower limit voltage. The upper limit voltage and the lower limit voltage are adjustable in response to a change in the power supply voltage. A pulse generation circuit is coupled to the input terminal, the triangle wave generation circuit, and a minimum duty cycle setting circuit. The pulse generation circuit is configured to generate the PWM pulse signal that has a duty cycle determined by the relative magnitude of the triangle wave signal, the input signal, and the minimum duty cycle setting voltage. In an embodiment of the PWM controller, the duty cycle is adjustable in response to the change in the power supply voltage.

A further understanding of the nature and advantages of the present invention may be realized by reference to the remaining portions of the specification and the drawings.

DETAILED DESCRIPTION OF THE INVENTION

In PWM control systems, a minimum duty cycle is often set to prevent the system output from fallen below a certain minimum output level, regardless of the status of control terminals. For example, in a fan speed control, a voltage at a control terminal varies depending on the temperature. The fan usually rotates at a fast speed when the temperature is high, and more slowly when the temperature is low. No matter how low the temperature is, however, it may be desirable that the fan operate at a certain minimum speed upon being turned on to ensure the safety of the cooling object. The PWM circuits having a fixed minimum duty cycle setting, however, often cannot achieve the purpose under certain conditions. e.g., when the power supply is too low. In other motor speed control applications, a small duty cycle can operate the motor when the supply voltage is high. However, a large duty cycle may be required to maintain motor operation when the supply voltage is low. Therefore, in PWM circuits having a fixed or decreasing minimum duty cycle setting, e.g., as illustrated below in FIGS. 1B-1D, it may be difficult to maintain the rotational speed of a motor the output of a regulated power supply at start up or under low supply voltage conditions.

Figure 1A:
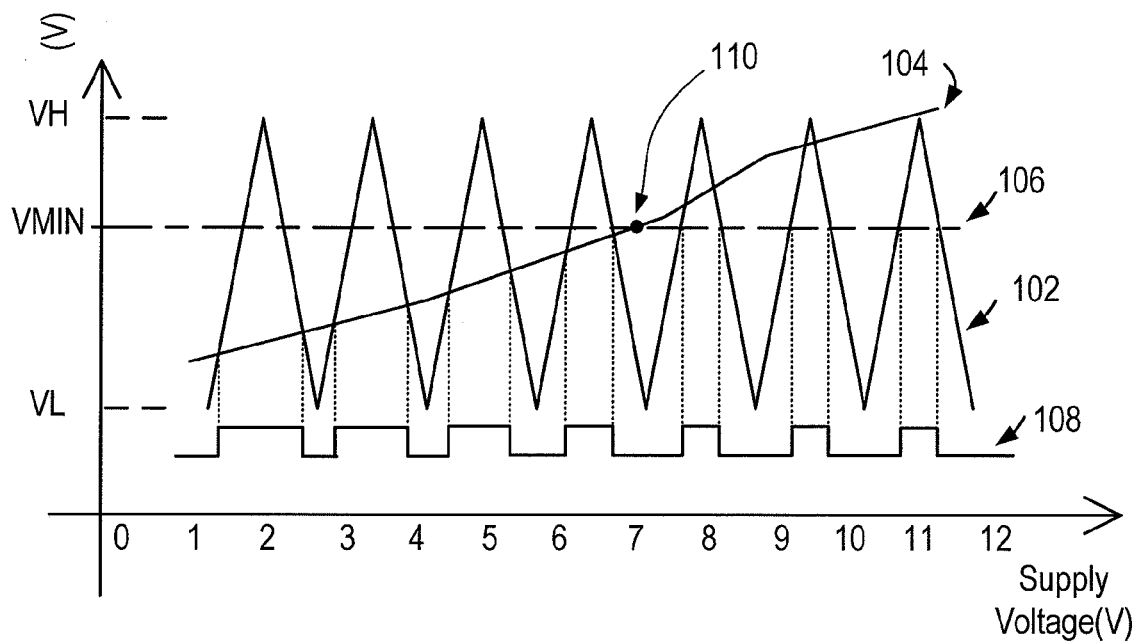
FIG. 1A is a simplified diagram illustrating the operation of a conventional PWM controller circuit having a minimum duty cycle feature.
Figure 1B:
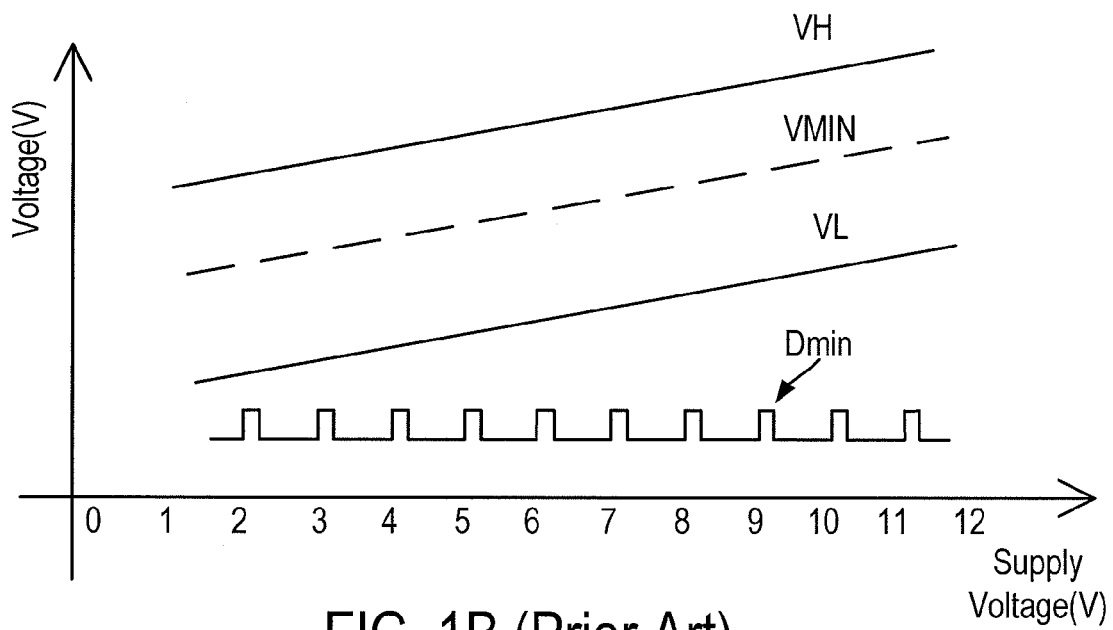
FIGS. 1B-1D are simplified diagrams illustrating the minimum duty cycle of a PWM signal as a function of supply voltage in conventional PWM controllers.
Figure 1C:
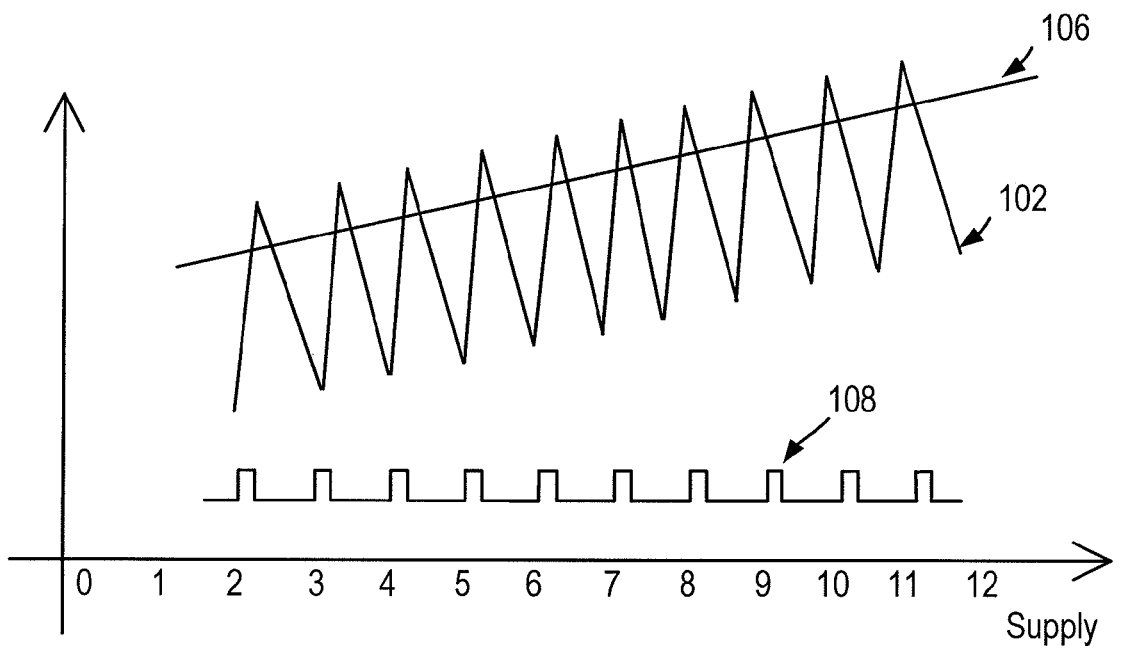
Figure 1D:
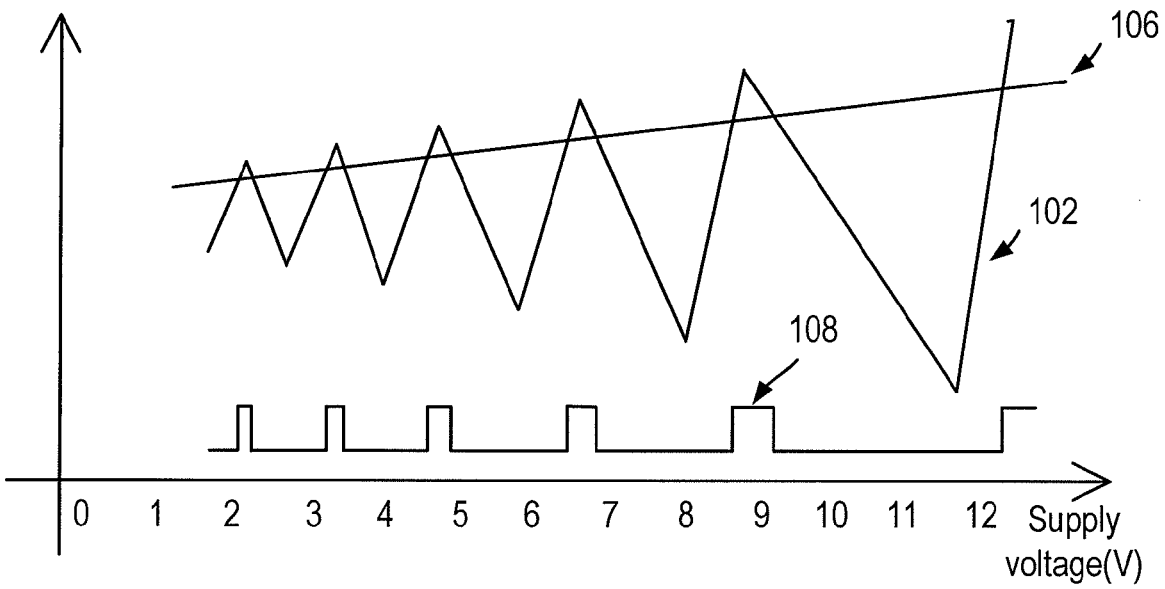

FIGS. 1B-1D are simplified diagrams illustrating the minimum duty cycle of a PWM signal as a function of supply voltage in conventional PWM controllers. In some conventional PWM control circuits, the minimum duty cycle is substantially independent of the supply voltage. Such a circuit is referred to herein as a PWM circuit having a fixed minimum duty cycle setting. An example of fixed minimum duty cycle is illustrated in FIG. 1B, in which upper limit voltage VH and lower limit voltage VL as well as minimum duty cycle setting voltage Vmin are linearly dependent on the power supply voltage. As a result, the minimum duty cycle Dmin is substantially constant and independent of the power supply voltage. The nearly fixed Dmin is also illustrated in FIG. 1C, in which the horizontal axis shows the supply voltage, and composite drawings of triangle wave 102, minimum duty cycle setting voltage 106, and minimum duty cycle PWM pulse signal 108 are superimposed in the figure to illustrate their dependence on the supply voltage. In FIG. 1C, both the triangle wave 102 and minimum duty cycle setting voltage 106 are derived from the supply voltage and both become smaller at lower supply voltages. As a result, minimum duty cycle of PWM signal 108 remains nearly independent of the supply voltage. In another example shown in FIG. 1D, minimum duty cycle of PWM signal 108 becomes smaller at lower voltages. Both examples are undesirable, because, as discussed above, a larger fixed duty cycle is often needed under low power supply conditions.

A conventional method to provide a larger minimum duty cycle is to increase the fixed minimum duty cycle. Using this design, the system can operate with an adequate minimum duty cycle under both high supply voltage and low supply voltage conditions. However, this method is not desirable due to high power consumption at high supply voltages. A preferred method according to embodiments of the invention is to use a PWM controller having a variable minimum duty cycle, i.e., a small minimum duty cycle when the supply voltage is high, and a large minimum duty cycle when the voltage is low. Thus, the system can easily start at low voltages, while saving energy and reducing noise at high voltages.

A viable method to implement a variable minimum duty cycle of a PWM controller is to vary the reference minimum duty cycle setting voltage in response to a change in the supply voltage. However, in some PWM controllers, it may be desirable to maintain a certain relationship between the minimum duty cycle setting voltage and the input signal. In this case, changing the minimum duty cycle setting voltage may require a corresponding change of the input signal. As a result, it can be difficult to maintain the voltage relations between the input terminals while maintaining proper minimum duty cycles.

In a preferred method according to an embodiment of the present invention, a PWM controller can vary the minimum duty cycle by changing the high voltage level and the low voltage level of the triangle wave. In an embodiment, a PWM controller has a triangle wave generation circuit for generating a triangle wave signal configured to oscillate between an upper limit voltage and a lower limit voltage. The upper limit voltage and the lower limit voltage are adjustable in response to a change in the power supply. The PWM controller also has a pulse generation circuit coupled to the triangle wave generation circuit and a minimum duty cycle setting voltage. The pulse generation circuit is configured to generate the PWM pulse signal having a minimum duty cycle determined by the relative magnitude of the triangle wave signal and the minimum duty cycle reference voltage. In this embodiment, the minimum duty cycle is adjustable in response to the change in the power supply voltage.

In some embodiments, the minimum duty cycle is relatively small when the supply voltage is higher than a predetermined value, and the minimum duty cycle is relatively large when the supply voltage is lower than the predetermined value. In some embodiments, varying the triangle wave signal also allows the magnitude of the duty cycle to change, not just the minimum duty cycle. In other embodiments, the method can be used to adjust the duty cycle according to other changes in operating conditions. For example, the PWM duty cycle can be reduced when the supply voltage exceeds a certain level, by lowering the high and low voltage limits of the triangle wave form. It is also noted that the term "triangle wave" is used herein interchangeably with the term "saw tooth wave."

Figure 2A:
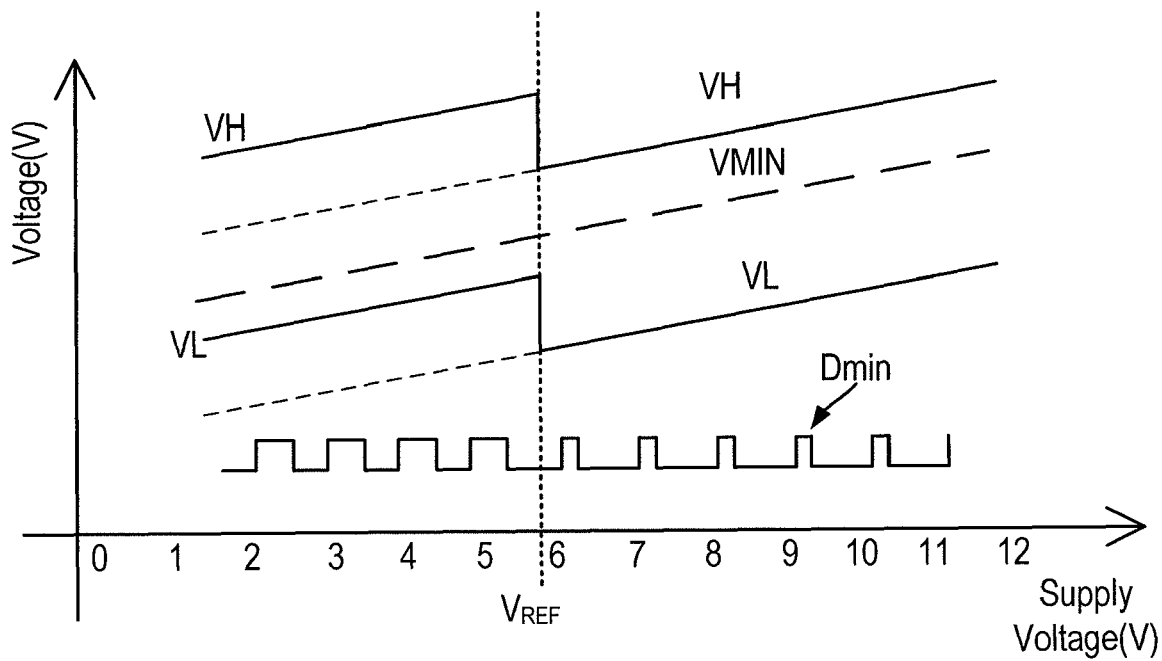
FIG. 2A is a simplified diagram illustrating the concept of a variable minimum duty cycle according to an embodiment of the present invention.

FIG. 2A is a simplified diagram illustrating the concept of a variable minimum duty cycle according to an embodiment of the present invention. As shown, upper limit voltage VH and lower limit voltage VL of the triangle wave signal, as well as minimum duty cycle setting voltage Vmin are dependent on the power supply voltage, similar to their parts in FIG. 1B. In this embodiment, however, when the power supply voltage is lower than a predetermined reference voltage $V_{REF}$, VH and VL are raised from their respective original values shown in dotted lines. As a result, the minimum duty cycle Dmin is increased when the power supply voltage is lower than $V_{REF}$.

Figure 2B:
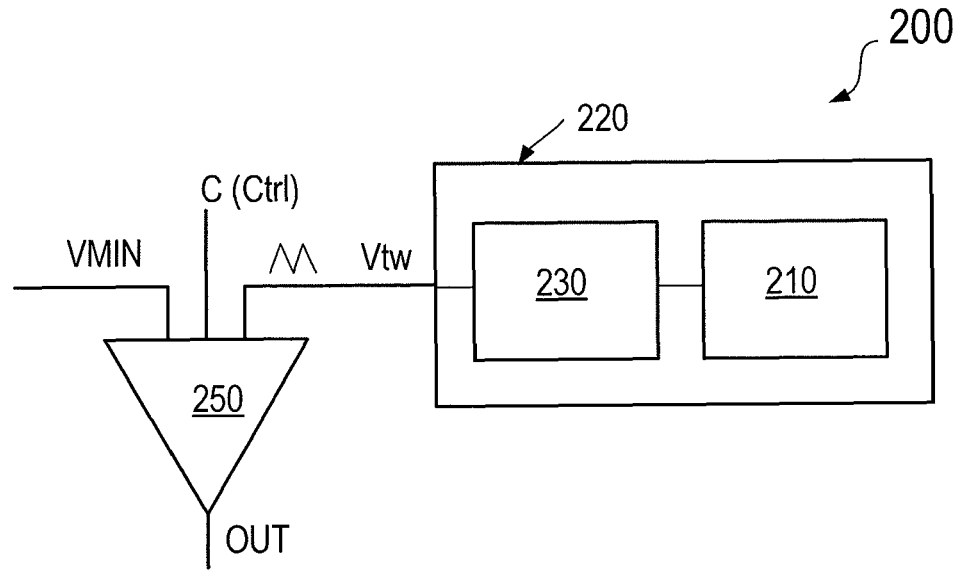
FIG. 2B is a simplified block diagram illustrating a pulse width modulated (PWM) controller having an adjustable duty cycle according to an embodiment of the present invention.

FIG. 2B is a simplified block diagram illustrating a pulse width modulated (PWM) controller 200 having an adjustable duty cycle according to an embodiment of the present invention. As shown, PWM controller 200 has an input terminal for receiving an input control signal C (Ctrl), an output terminal OUT for outputting a PWM pulse signal, a power supply terminal VCC (not shown) for receiving a power supply voltage, and a ground terminal GND (not shown). Note that as used herein, a terminal and the signal at that terminal are designated by the same label or reference numeral. PWM controller 200 also has an adjustable triangle wave generation circuit 220 for generating an adjustable triangle wave signal Vtw. A pulse generation circuit 250 is configured for generating PWM pulse output OUT in response to input control signal C, adjustable triangle wave signal Vtw, and a minimum duty cycle setting voltage VMIN.

In an embodiment, adjustable triangle wave generation circuit 220 includes a triangle wave generator 230 which generates a triangle wave signal oscillating between an upper limit voltage VH and a lower limit voltage VL (not shown). Upper limit voltage VH and lower limit voltage VL can be adjusted depending on supply voltage VCC. For example, as illustrated above in FIG. 2A, VH and VL can be adjusted to higher voltages when power supply voltage VCC is lower than a predetermined reference voltage. In a specific embodiment, as shown in FIG. 2B, adjustable triangle wave generation circuit 220 also has a supply voltage detection and controller 210, which provides information for modifying VH and VL.

In PWM controller, the PWM pulse signal has a minimum duty cycle determined by the relative magnitude of triangle wave signal Vtw and minimum duty cycle reference voltage VMIN. Furthermore, the minimum duty cycle is adjustable in response to a change in the power supply voltage. In a specific embodiment, the minimum duty cycle is increased when the power supply voltage is lower than the predetermined reference voltage. In an embodiment, a minimum duty cycle setting circuit can be used for providing a minimum duty cycle reference voltage VMIN.

Figure 3:
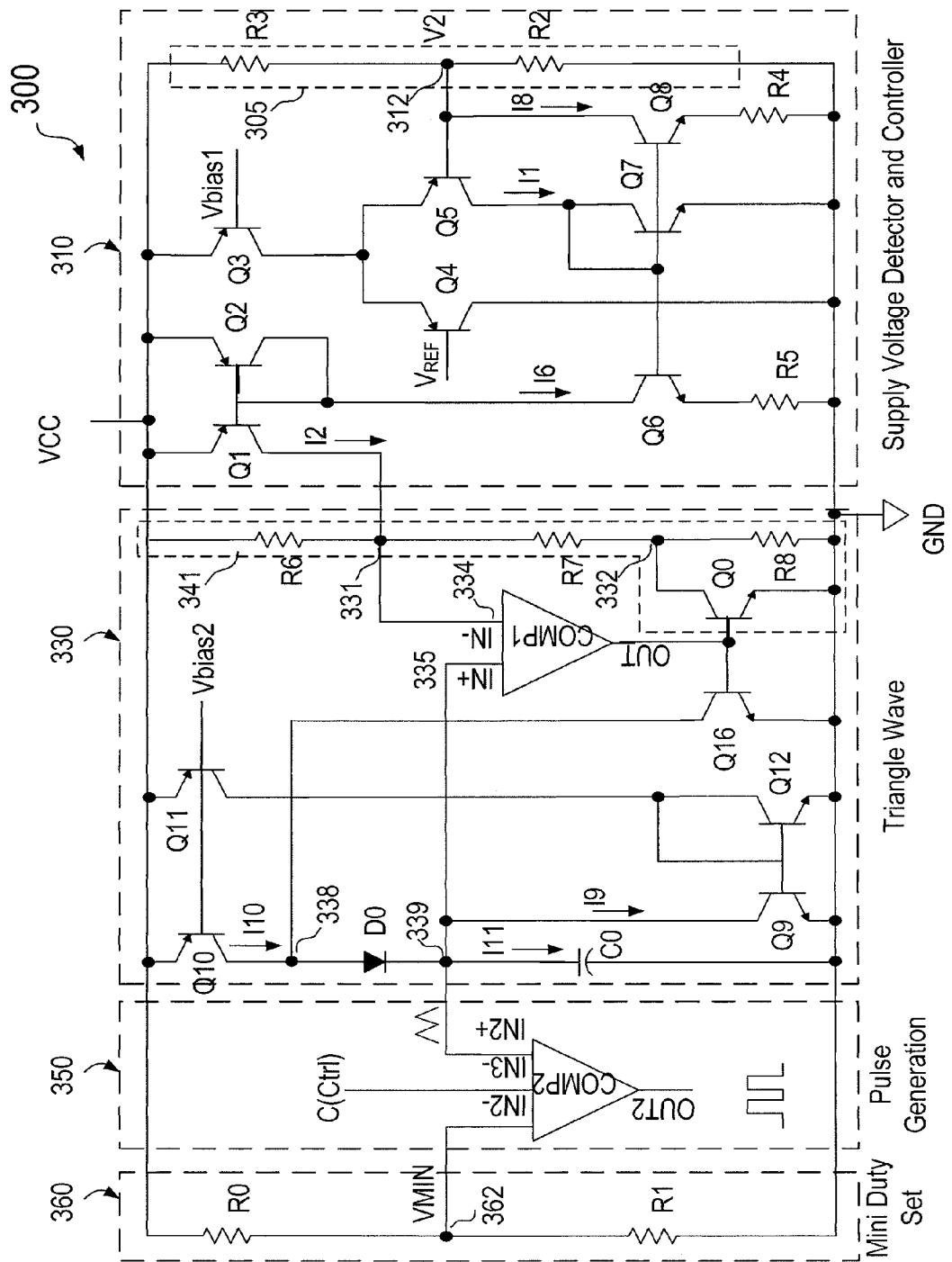
FIG. 3 is a simplified schematic diagram illustrating a PWM controller having a duty cycle that is adjustable when the supply voltage drops below a reference level according to a specific embodiment of the PWM controller of FIG. 2.

FIG. 3 is a simplified schematic diagram illustrating a PWM controller 300 having a duty cycle that is adjustable when the supply voltage drops below a certain level according to a specific embodiment of PWM controller 200 of FIG. 2. In FIG. 3, block 310 is a supply voltage detector and controller, corresponding to block 210 of FIG. 2. As described below, block 310 is configured to generate a bias current I2 and to generate a hysteresis voltage when a voltage comparator detects that supply voltage VCC is less than a predetermined voltage value. In block 310, supply voltage detector circuit 305 includes resistors R3 and R2 connected in series between supply VCC and ground GND. Voltage V2 at node 312 between resistors R2 and R3 is linearly correlated to supply voltage VCC and is given by:

$$V2 = VCC * \frac{R2}{(R3 + R2)}, \quad (1)$$

In an embodiment, V2 represents a fraction of supply voltage used for monitoring the change in power supply voltage VCC.

Block 310 also includes a voltage comparing circuit, including transistors Q3, Q4, and Q5, which compares voltage V2 detected in the supply voltage detecting circuit 305 with a reference voltage $V_{REF}$, which is selected as a low voltage reference. Transistors Q4 and Q5 are arranged as a differential pair, with a current supplied by transistor Q3. The base of the transistor Q3 is connected to a biasing voltage Vbias1. The collector of transistor Q3 is connected to the emitters of transistors Q4 and Q5 to supply current to transistors Q4 and Q5. The base and collector of the transistor Q4 are connected to reference voltage $V_{REF}$ and ground, respectively. The base of the transistor Q5 is connected to node 312 to receive V2 from the output of the supply voltage detecting circuit 305 described above.

Block 310 also includes a constant current supply circuit and a hysteresis voltage circuit, including transistors Q1, Q2, Q6, Q7, and Q8, and resistors R4, R3, and R5. Transistors Q6, Q7, and Q8 form a common base current mirror, in which the base and collector of transistor Q7 are short-circuited and connected to the collector of the transistor Q5. The collector of Q8 is connected to node 312, which is connected to the base of Q5 and resistors R3 and R2. When the voltage comparator, including Q4 and Q5, detects that V2 is lower than a predetermined voltage value $V_{REF}$, i.e., supply voltage VCC has dropped below a predetermined level, transistor Q5 is turned on and transistor Q4 is turned off. Under this condition, current I1 flows from the collector of transistor Q5 toward transistor Q7. Since Q7 is part of the current mirror that also includes Q6 and Q8, current I1 in Q7 causes currents I6 and I8 to flow in transistors Q6 and Q8, respectively. In turn, current I6 in transistor Q6 causes a current I2 to flow from the collector of transistor Q1, through current mirror arrangement of transistors Q2 and Q1. Thus, current I2 flows when V2 is lower than $V_{REF}$. On the other hand, when V2 is higher than $V_{REF}$, Q4 is on and Q5 is off. Under this condition, the current from Q3 flows through Q4 to ground, and current I1 is turned off. As a result, Q6 and Q7 are off, causing I2 to be turned off when V2 is higher than $V_{REF}$. As described below, current I2 is used for adjusting the minimum duty cycle of the PWM control signals, when a low VCC condition is detected.

As an example, in a specific embodiment, a PWM controller is designed to operate with a power supply of 12V, and it is desirable to trigger the low-voltage minimum duty cycle when VCC drops to about 5V. For this application, resistances R3=4K and R2=1K may be used. In this case, the sensed supply voltage V2=1.0V according to equation (1)

$$V2 = VCC * \frac{R2}{(R3 + R2)},$$

when VCC drops to 5.0V and V2=1.0V. In other words, if $V_{REF}$ is set at a voltage above 1.0V, for example, 1.2V, V2=1.0V will trigger current I2. Of course, there can be many variations and modifications.

In block 310, current I8 of transistor Q8 flows through resistor R3 and generates a hysteresis voltage, causing voltage V2 at nodes 312 to drop. In other words, the output of the comparator will not change state until supply voltage VCC reaches a level higher than the previously detected low voltage. In an specific embodiment, the hysteresis voltage is substantially equal to I8*R3.

In FIG. 3 triangle wave generator circuit 330 includes resistors R6, R7, and R8, comparator COMP1, transistors Q0, Q9, Q10, Q11, Q12, and Q16, capacitor C0, and diode D0. Resistors R6, R7, and R8 are connected in series between supply voltage VCC and ground terminal GND, with node 331 between R6 and R7, and node 332 between R7 and R8. Node 331 is connected to negative terminal 334 (IN−) of comparator COMP1. An output OUT1 of comparator COMP1 is connected to the base terminals of transistors Q0 and Q16. The collector of Q0 is connected to node 332 between R7 and R8. Switch transistor Q0 and resistors R6, R7, and R8 form a variable reference voltage source 341, which provides reference input voltages to comparator COMP1, as described below. The collector of Q16 is connected to the collector of Q10 and the positive terminal of diode D0 at node 338. A positive terminal 335 (IN+) of comparator COMP1 is connected to node 339 between capacitor C0 and diode D0. In addition, transistors Q10 and Q11 are arranged as current sources controlled by voltage Vbias2.

In an embodiment, the triangle wave signal is generated through charging and discharging of capacitor C0. The charging current is provided by a first current I10 from transistor Q10 configured as a current source. Current I10 charges capacitor C0 via diode D0. The discharging current is provided by a second current I9 flowing into transistor Q9 which is configured as a current sink, and I9 is derived in a current mirror including Q9, Q12, and Q11.

In the charging phase, the voltage at node 339 of capacitor C0 is low. Positive input terminal 335 (IN+) of comparator COMP1, which is connected to node 339, is lower than negative input terminal 334 (IN−) of comparator COMP1, causing comparator output OUT1 to be low, e.g., at or near the potential at GND. As a result, both transistors Q0 and Q16 are off. Under this condition, current I10 from transistor Q10 provides a charging current I11 for capacitor C0 and current I9 which flows into Q9. Additionally, the voltage at negative input terminal 334 (IN−) of comparator COMP1, which is connected to node 331 between R6 and R7, is the upper limit voltage VH of the triangle wave and can be expressed as follows:

$$VH = VCC * \frac{(R7 + R8)}{(R6 + R7 + R8)} \quad (2)$$

The charging of capacitor C0 continues until the voltage at node 339 and at node 335 (IN+) of comparator COMP1 becomes higher than VH at node 334 (IN−) of COMP1. At this point output signal OUT of comparator COMP1 becomes high (e.g., at or near VCC), both transistors Q0 and Q16 are turned on, and the discharging phase begins. Since Q16 is turned on, node 338 at the collector of Q10 is pulled low, and diode D0 is turned off. As a result, current I10 is diverted to transistor Q16, and capacitor C0 discharges with current I9 through transistor I9. Moreover, because transistor Q0 is on, node 332 is pulled low to near GND, the voltage at node 331 and negative input 334 (IN−) of COMP1 is the lower limit voltage VL of the triangle wave and can be expressed as follows:

$$VL = VCC * \frac{R7}{(R6 + R7)} \quad (3)$$

The discharging of capacitor C0 continued until the voltage at node 339 becomes lower than VL, at which point the output of comparator COMP1 becomes low, and the charging phase is started again.

As a result of repeated charging and discharging of capacitor C0, as described above, a triangle wave form is generated at node 339. The amplitude of the triangle wave form is between VH and VL as described in equation (2) and equation (3) above. It is also noted that both VH and VL depend on VCC. As a result, for a constant reference signal, the duty cycle is smaller at lower VCC. As a result, when VCC is low, the duty cycle is lower, which may cause insufficient power output in a power supply.

In a specific embodiment, the ratio of discharging current I9 to charging current I10 is set to 1:2. In this case, the charging current for capacitor C0 is the same as the discharging current, and the triangle wave signal is substantially symmetric. In other embodiments, different current ratios can also be used to obtain the desired triangle or saw-tooth wave form.

As described above, when supply voltage VCC is low, i.e., when $$V2 = VCC * \frac{R2}{(R3 + R2)}$$

is lower than predetermined reference voltage $V_{REF}$, current I2 generated in Q1 flows through the resistors R7 and R8, raising the voltage at node 331. As a result, the upper and the lower levels of the triangle wave are now given, respectively, by:

$$VH = I2 * (R7 + R8) + VCC * \frac{(R7 + R8)}{(R6 + R7 + R8)} \quad (4)$$

and $$VL = I2 * R7 + VCC * \frac{R7}{(R6 + R7)} \quad (5)$$

PWM control circuit 300 as shown in FIG. 3 also includes a pulse generating circuit 350 and a minimum duty cycle setting circuit 360. Minimum duty cycle setting circuit 360 includes resistors R0 and R1, which are connected between supply VCC and ground GND. The minimum duty cycle setting voltage VMIN is the voltage at node 362 between R0 and R1. Pulse generating circuit 350 has a three-terminal voltage comparator COMP2. A positive input terminal IN2+ of comparator COMP2 is connected to the triangle wave at node 339, and a negative input terminal IN2− is connected to node 362 between resistors R0 and R1, which is a minimum duty cycle setting terminal (VMIN). Additionally, a second negative input terminal IN3− is used for receiving an input control signal at terminal C (Ctrl). When the voltage at terminal C is lower than the voltage at terminal VMIN, the duty cycle of output pulse OUT2 is determined by comparing the voltage at terminal C to the voltage range of the triangle wave at 339. More particularly, the lower the voltage at terminal C is, the greater the duty cycle of the output pulse is. In the case when the voltage at terminal C is lower than the low level of the triangle wave, the output pulses are all at high level and the duty cycle of the output pulse is 100%.

When the voltage at terminal C is higher than the voltage at terminal VMIN, the duty cycle of output pulse is determined by the comparing the voltage at terminal VMIN to the triangle wave. The duty cycle output at this time is the minimum duty cycle. With the voltage at terminal VMIN denoted as Vmin, the minimum duty cycle Dmin is given by the following equations.

When the supply voltage VCC is relatively high, i.e., $V2 > V_{REF}$, I2 is not activated, and the minimum duty cycle is given by:

$$Dmin = \frac{VH - Vmin}{VH - VL} = \frac{\frac{(R7 + R8)}{(R6 + R7 + R8)} - \frac{R1}{(R0 + R1)}}{\frac{(R7 + R8)}{(R6 + R7 + R8)} - \frac{R7}{(R6 + R7)}} \quad (6)$$

where the minimum duty cycle setting voltage Vmin is given by:

$$V\min = VCC * \left(\frac{R1}{R0 + R1}\right) \quad (7)$$

When supply voltage VCC is low, i.e., $V2<V_{REF}$, I2 is activated. As a result, VH and VL are raised, and the minimum duty cycle Dmin is given by the following equation:

$$D\min = \frac{VH - V\min}{VH - VL} = \frac{I2*(R7+R8) + VCC*\frac{(R7+R8)}{(R6+R7+R8)} - VCC*\frac{R1}{(R0+R1)}}{I2*(R7+R8) + VCC*\frac{(R7+R8)}{(R6+R7+R8)} - \left(I2*R7 + VCC*\frac{R7}{(R6+R7)}\right)} \quad (8)$$

which can be expressed as follows:

$$D\min = \frac{VH - V\min}{VH - VL} \quad (9)$$

$$= \frac{\frac{I2*(R7+R8)}{VCC} + \frac{(R7+R8)}{(R6+R7+R8)} - \frac{R1}{(R0+R1)}}{\frac{I2*R8}{VCC} + \frac{(R7+R8)}{(R6+R7+R8)} - \frac{R7}{(R6+R7)}}$$

The above equations show that when the supply voltage is lower than a predetermined reference voltage, contribution from I2 raises the triangle wave form which, in turn, increases the minimum duty cycle. Additionally, the change in the triangle wave form also impacts the duty cycle D of the PWM signal, even when Dmin is not activated. Specifically, in the embodiment of FIG. 3, the duty cycle D of the PWM signal is determined by a comparison of input signal Vin and the triangle wave, and can be expressed as follows:

When the supply voltage is relatively high, i.e., $VCC>V_{REF}$, I2 is not activated, and duty cycle D is given by:

$$D = \frac{VH - Vin}{VH - VL} = \frac{VCC*\frac{(R7+R8)}{(R6+R7+R8)} - Vin}{VCC*\frac{(R7+R8)}{(R6+R7+R8)} - VCC*\frac{R7}{(R6+R7)}} \quad (10)$$

which can be expressed as follows:

$$D = \frac{VH - Vin}{VH - VL} = \frac{\frac{(R7+R8)}{(R6+R7+R8)} - \frac{Vin}{VCC}}{\frac{(R7+R8)}{(R6+R7+R8)} - \frac{R7}{(R6+R7)}} \quad (11)$$

When supply voltage VCC is low, i.e., $V2<V_{REF}$, I2 is activated, and duty cycle D is given by the following equation:

$$D = \frac{VH - Vin}{VH - VL} = \frac{I2*(R7+R8) + VCC*\frac{(R7+R8)}{(R6+R7+R8)} - Vin}{I2*(R7+R8) + VCC*\frac{(R7+R8)}{(R6+R7+R8)} - \left(I2*R7 + VCC*\frac{R7}{(R6+R7)}\right)} \quad (12)$$

which can be expressed as follows:

$$D = \frac{VH - Vin}{VH - VL} = \frac{\frac{I2*(R7+R8)}{VCC} + \frac{(R7+R8)}{(R6+R7+R8)} - \frac{Vin}{VCC}}{\frac{I2*R8}{VCC} + \frac{(R7+R8)}{(R6+R7+R8)} - \frac{R7}{(R6+R7)}} \quad (13)$$

Thus the duty cycle, D, is also increased from the contribution from I2.

Figure 4:
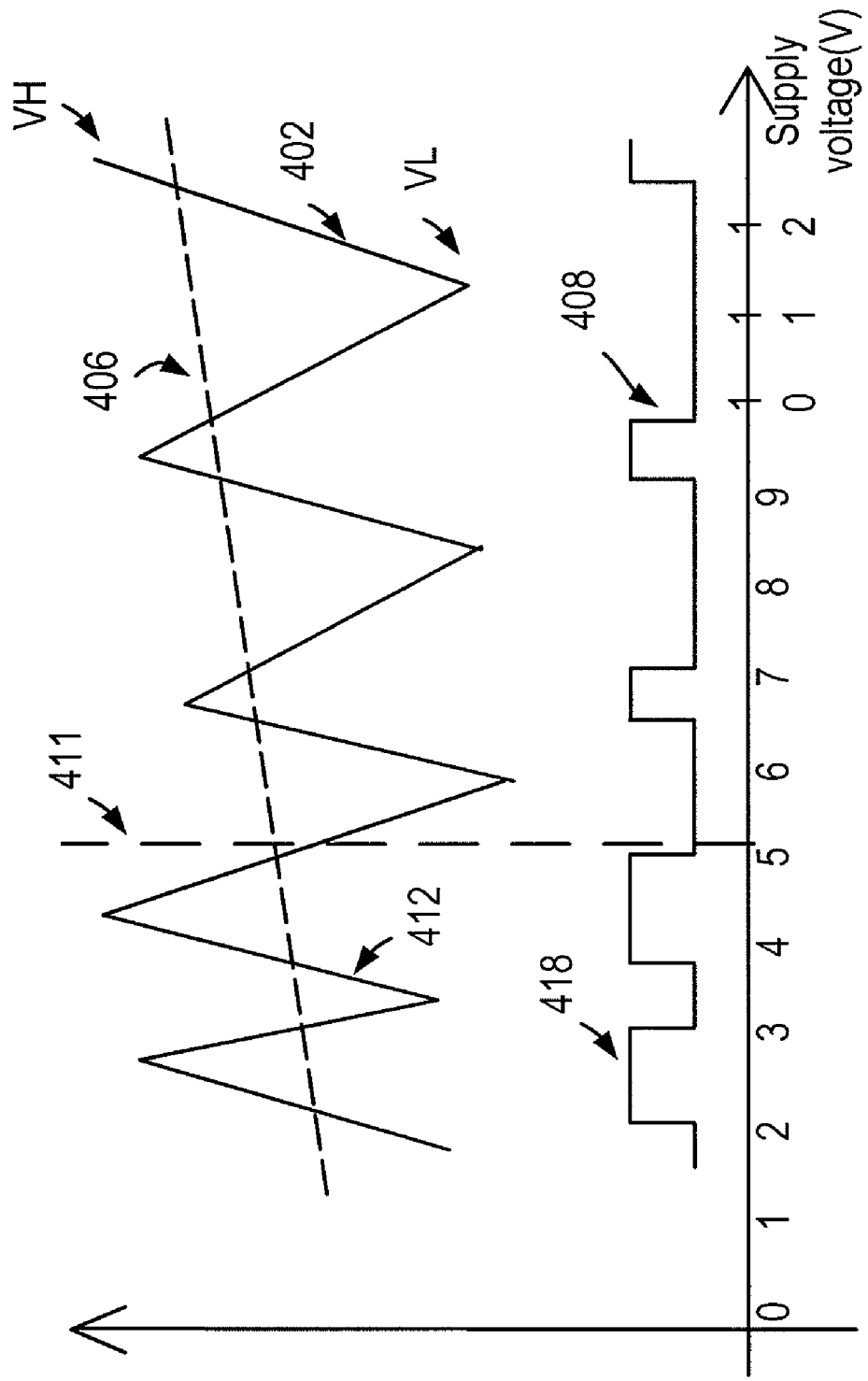
FIG. 4 is a simplified diagram illustrating the increase of the minimum duty cycle of a PWM signal at low supply voltages according to an embodiment of the present invention.

FIG. 4 is a simplified diagram illustrating the increase of the minimum duty cycle of a PWM signal at low voltages according to an embodiment of the present invention. In FIG. 4, the horizontal axis shows the supply voltage, and composite drawings of triangle wave 402, minimum duty cycle setting voltage 406, and minimum duty cycle PWM pulse signal 408 are superimposed in the figure to illustrate their dependence on the supply voltage. As shown, minimum duty cycle PWM pulse signal 408 is determined by comparing triangle wave 402 with minimum duty cycle setting voltage 406. At lower supply voltage, e.g., when VCC is less than about 5V as shown by the vertical line 411, triangle wave signal 412 is raised. As a result, the minimum duty cycle PWM signal 418 is increased at lower voltages. Note in FIG. 4, the various signals are not drawn to scale, and are shown in the composite drawing merely to illustrate the main features of the embodiment.

Figure 5:
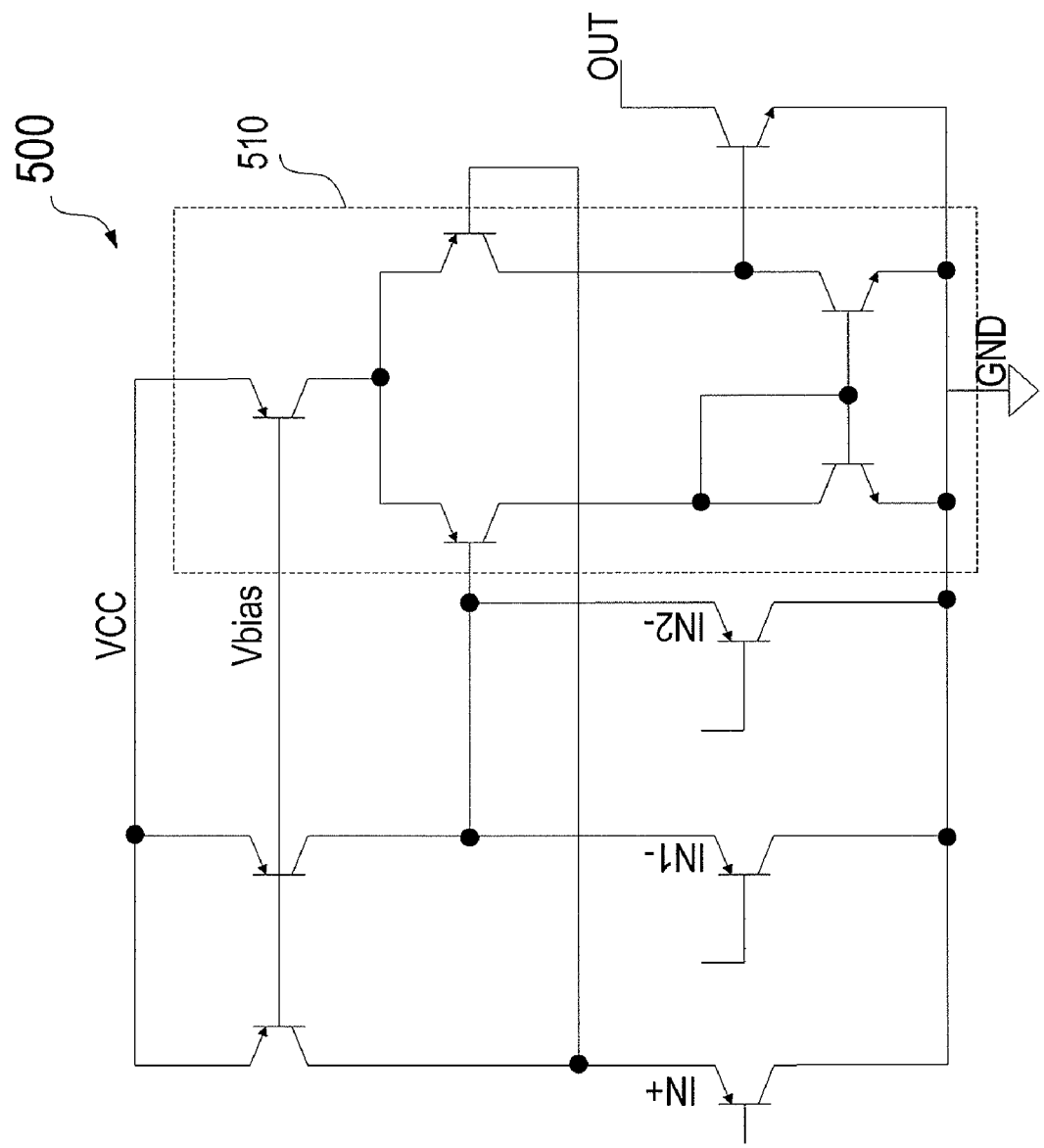
FIG. 5 is a simplified schematic diagram illustrating a 3-input comparator according to an embodiment of the present invention.

FIG. 5 is a simplified schematic diagram illustrating a 3-input comparator 500 according to an embodiment of the present invention. As shown, comparator 500 includes a differential pair 510, which receives three inputs. Input "IN1–" and "IN2–" are connected to a negative input terminal of differential pair 510, and input "IN+" is connected to a positive input terminal of differential pair 510. Comparator 500 is merely an example of comparators that can be used in the pulse generation circuit 350 of FIG. 3. Of course, there can be other variation, modifications, and alternatives.

Figure 6:
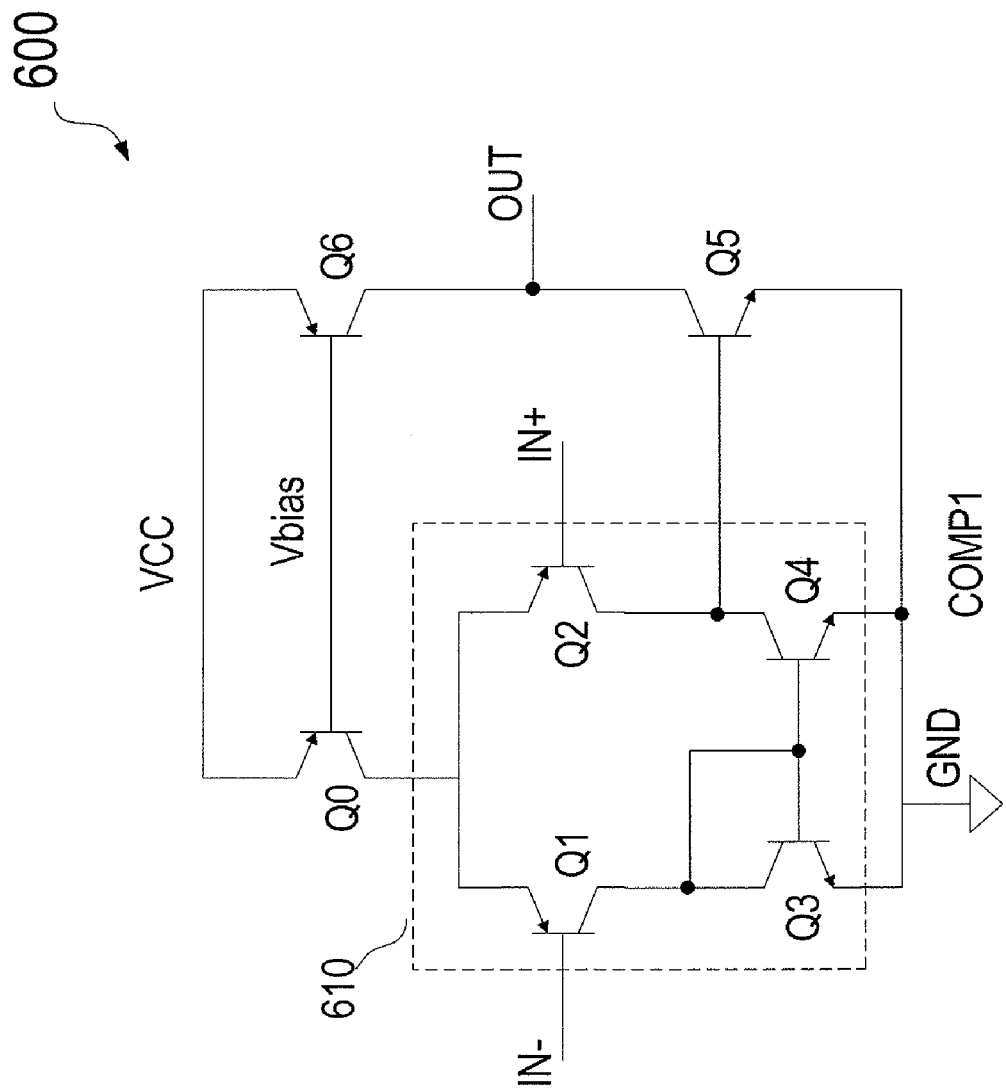
FIG. 6 is a simplified schematic diagram illustrating a 2-input comparator according to an embodiment of the present invention.

FIG. 6 is a simplified schematic diagram illustrating a 2-input comparator 600 according to an embodiment of the present invention. As shown, comparator 600 includes a differential pair 610, which includes transistors Q0-Q4 and receives two inputs. Input "IN–" is connected to a negative input terminal of differential pair 610, and input "IN+" is connected to a positive input terminal of differential pair 610. Comparator 600 is merely an example of comparators that can be used in the triangle wave generation circuit 330 of FIG. 3. FIG. 6 is merely an example, and one skilled in the art will recognize that other comparator circuits can also be used.

While certain embodiments of the invention have been illustrated and described, those skilled in the art with access to the present teachings will recognize that the invention is not limited to these embodiments only. Numerous modifications, changes, variations, substitutions, and equivalents will be apparent to those skilled in the art. Merely by way of example, the invention has been applied to switching mode power supplies (SMPS). But it would be recognized that the invention has a much broader range of applicability. Accordingly, it is to be understood that the invention is intended to cover all variations, modifications, and equivalents within the scope of the following claims.

What is claimed is:

1. A pulse width modulated (PWM) controller, comprising:
a power supply terminal for receiving a power supply voltage;
a ground terminal;
an input terminal for receiving an input signal;
an output terminal for outputting a PWM pulse signal;
a triangle wave generation circuit for generating a triangle wave signal configured to oscillate between an upper limit voltage and a lower limit voltage, the upper limit voltage and the lower limit voltage being adjustable in response to a change in the power supply; and
a pulse generation circuit coupled to the input terminal, the triangle wave generation circuit, and a minimum duty cycle setting voltage, the pulse generation circuit being configured to generate the PWM pulse signal having a minimum duty cycle determined by the relative magnitude of the triangle wave signal and the minimum duty cycle reference voltage,
wherein the minimum duty cycle is adjustable in response to the change in the power supply voltage.

2. The PWM controller of claim 1 wherein the upper limit voltage and the lower limit voltage of the triangle wave signal are raised when the power supply voltage is lower than a predetermined reference voltage.

3. The PWM controller of claim 1 wherein the triangle wave generation circuit comprises:
a capacitor having an output terminal for providing the triangle wave signal;
a first current source coupled to the capacitor through a diode, the first current source being configured for charging the capacitor;
a second current source coupled to the capacitor and being configured for discharging the capacitor;
a variable reference voltage source configured to provide the upper limit voltage when the capacitor is being charged and the lower limit voltage when the capacitor is being discharged, the variable reference voltage source being further configured to receive a bias current for raising the upper limit voltage and the lower limit voltage when the power supply voltage is lower than the predetermined reference voltage;
a first comparator having a first input coupled to the capacitor and a second input coupled to the variable reference voltage source; and
a first switch transistor configured to couple the first current source to the capacitor in response to the output of the comparator.

4. The PWM controller of claim 3 wherein the variable reference voltage source comprises:
a first voltage divider having a first resistor, a second resistor, and a third resistor connected in series between the power supply terminal and the ground terminal;
a first node between the first and the second resistors adapted for providing the upper limit voltage and the lower limit voltage of the triangle wave signal, the first node being also adapted for receiving the bias current that is configured to raise the upper limit voltage and the lower limit voltage; and
a second switch transistor coupled to the first comparator and to a second node between the second and the third resistors, the second switch transistor being configured to connect the second node to the ground in response to the output of the comparator.

5. The PWM controller of claim 4 further comprising a supply voltage detector and controller configured to provide the bias current, the supply voltage detector and controller including:
a second voltage divider having a fourth resistor and a fifth resistor connected between the power supply terminal and the ground terminal, the second voltage divider having a third node between the fourth resistor and the fifth resistor for sensing the power supply voltage;
a second comparator coupled to the third node for comparing the sensed voltage with the predetermined reference voltage; and
a third current source coupled to an output of the second comparator for providing the bias current when the sensed voltage is lower than the predetermined reference voltage.

6. The PWM controller of claim 5 wherein the supply voltage detector and controller further comprises a fourth current source coupled to the third node for producing a hysteresis voltage in the fourth resistor when the sensed voltage is lower than the predetermined reference voltage.

7. The PWM controller of claim 3 wherein the first current source is configured to provide a current that is approximately twice the current provided by the second current source.

8. The PWM controller of claim 1 wherein the PWM pulse signal comprises a first state and a second state, the PWM pulse signal being in the first state when the lower one of the input signal and the minimum duty cycle reference voltage is higher than the triangle wave signal, the PWM pulse signal being in the second state when the lower one of the input signal and the minimum duty cycle reference voltage is lower than the triangle wave signal.

9. The PWM controller of claim 1 wherein the pulse generation circuit comprises a third comparator having at least three input terminals configured to receive the triangle wave signal, the input signal, and the minimum duty cycle reference voltage, respectively.

10. The PWM controller of claim 1 wherein the minimum duty cycle setting voltage is provide by a minimum duty cycle setting circuit comprising:
a sixth resistor and a seventh resistor connected between the power supply terminal and the ground terminal, a sixth node between the sixth and the seventh resistors providing the minimum duty cycle setting voltage.

11. A pulse width modulated (PWM) controller, the PWM controller comprising:
a power supply terminal for receiving a power supply voltage;
a ground terminal;
an input terminal for receiving an input signal;
an output terminal for outputting a PWM pulse signal;
a triangle wave generation circuit for generating a triangle wave signal configured to oscillate between an upper limit voltage and a lower limit voltage, the upper limit voltage and the lower limit voltage being adjustable in response to a change in the power supply; and
a pulse generation circuit coupled to the input terminal, the triangle wave generation circuit, and a minimum duty cycle reference voltage, the pulse generation circuit being configured to generate the PWM pulse signal that has a duty cycle determined by the relative magnitude of the triangle wave signal, the input signal, and the minimum duty cycle setting voltage;
whereby the duty cycle is adjustable in response to the change in the power supply voltage.

12. The PWM controller of claim 11 wherein the upper limit voltage and the lower limit voltage of the triangle wave signal are raised when the power supply voltage is lower than a predetermined reference voltage.

13. The PWM controller of claim 11 wherein the triangle wave generation circuit comprises:
- a capacitor having an output terminal for providing the triangle wave signal;
- a first current source coupled to the capacitor through a diode, the first current source being configured for charging the capacitor;
- a second current source coupled to the capacitor and being configured for discharging the capacitor;
- a variable reference voltage source configured to provide the upper limit voltage when the capacitor is being charged and the lower limit voltage when the capacitor is being discharged, the variable reference voltage source being further configured to receive a bias current for raising the upper limit voltage and the lower limit voltage when the power supply voltage is lower than the predetermined reference voltage;
- a first comparator having a first input coupled to the capacitor and a second input coupled to the variable reference voltage source; and
- a first switch transistor configured to couple or decouple the first current source to the capacitor in response to the output of the comparator.

14. The PWM controller of claim 13 wherein the variable reference voltage source comprises:
- a first voltage divider having a first resistor, a second resistor, and a third resistor connected in series between the power supply terminal and the ground terminal;
- a first node between the first and the second resistors, the first node for providing the upper limit voltage and the lower limit voltage of the triangle wave signal to the second input of the first comparator, the first node being adapted for receiving the bias current that is configured to raise the upper limit current and the lower limit current; and
- a second switch transistor coupled to the first comparator and to a second node between the second and the third resistors, the second switch transistor being configured to connect the second node to the ground in response to the output of the comparator.

15. The PWM controller of claim 14 further comprising a supply voltage detector and controller configured to provide the bias current, the supply voltage detector and controller including:
- a second voltage divider having a fourth resistor and a fifth resistor connected between the power supply terminal and the ground terminal, the second voltage divider having a third node between the fourth resistor and the fifth resistor for sensing the power supply voltage;
- a second comparator coupled to the third node for comparing the sensed voltage with predetermined reference voltage; and
- a third current source coupled to an output of the second comparator for providing the bias current when the sensed voltage is lower than predetermined reference voltage.

16. The PWM controller of claim 15 wherein the supply voltage detector and controller further comprises a fourth current source coupled to the third node for producing a hysteresis voltage in the fourth resistor when the sensed voltage is lower than the predetermined reference voltage.

* * * * *